United States Patent
Kobayashi et al.

(10) Patent No.: US 7,542,529 B2
(45) Date of Patent: Jun. 2, 2009

(54) WIRELESS RECEIVING DEVICE SUPPRESSING OCCURRENCE OF RECEPTION ERROR

(76) Inventors: Chikako Kobayashi, c/o Sanyo Electric Co., Ltd., 5-5, Keihanhondori 2-chome, Moriguchi-shi, Osaka 570-8677 (JP); Takeo Miyata, c/o Sanyo Electric Co., Ltd., 5-5, Keihanhondori 2-chome, Moriguchi-shi, Osaka 570-8677 (JP)

( * ) Notice: Subject to any disclaimer, the term of this patent is extended or adjusted under 35 U.S.C. 154(b) by 828 days.

(21) Appl. No.: 11/007,292

(22) Filed: Dec. 9, 2004

(65) Prior Publication Data

US 2005/0129151 A1   Jun. 16, 2005

(30) Foreign Application Priority Data

Dec. 15, 2003   (JP)   ............. 2003-416311

(51) Int. Cl.
H04B 1/69   (2006.01)
(52) U.S. Cl. ............. 375/345; 375/316; 375/329; 375/331; 455/234.1; 455/232.1; 455/230; 455/245; 330/254
(58) Field of Classification Search ........ 375/316, 375/345, 331, 329
See application file for complete search history.

(56) References Cited

U.S. PATENT DOCUMENTS 7,196,579 B2 * 3/2007 Ozawa ............. 330/133

2002/0003836 A1 * 1/2002 Azakami et al. ............. 375/239
2003/0194981 A1   10/2003 Rimini et al.

FOREIGN PATENT DOCUMENTS

| JP | 05-327540 | 12/1993 |
|---|---|---|
| JP | 10-056343 | 2/1998 |
| JP | 11-331066 | 11/1999 |
| JP | 2000-252868 | 9/2000 |
| JP | 2001-168664 | 6/2001 |
| JP | 2002-077007 | 3/2002 |
| JP | 2003-110526 | 4/2003 |
| JP | 2003-115773 | 4/2003 |
| JP | 2003-158435 | 5/2003 |
| JP | 2003-158557 | 5/2003 |

OTHER PUBLICATIONS

Numata Takayuki, Radio equipment and method for controlling gain thereof, Apr. 18, 2003, a translated copy of Japan Patent applicaiton 2003-115773.*

* cited by examiner

*Primary Examiner*—Chieh M Fan
*Assistant Examiner*—Siu M Lee
(74) *Attorney, Agent, or Firm*—Foley & Lardner LLP

(57) ABSTRACT

An AGC processing portion receives a burst signal of each received frame, and measures its received power level to perform gain control of a variable gain amplifier. Unlike a conventional wireless receiving device, a digital signal from an A/D converter is directly supplied to the AGC processing portion, without passing through an FIR filter. Accordingly, the input timing for the AGC processing portion does not include a delay due to the FIR filter, and an amplitude value can be adjusted to be appropriate from the leading part of each frame, suppressing the occurrence of a reception error due to AGC processing.

2 Claims, 3 Drawing Sheets

WIRELESS RECEIVING DEVICE SUPPRESSING OCCURRENCE OF RECEPTION ERROR

BACKGROUND OF THE INVENTION

1. Field of the Invention

The present invention relates to a wireless receiving device, and more particularly, to a wireless receiving device used in a mobile communications system, for example, at its base station.

2. Description of the Background Art

In wireless receiving devices, Automatic Gain Control (AGC) has been widely employed for converging the level of a received signal having significantly been attenuated during propagation, to a desired level (for example, see Japanese Patent Laying-Open No. 2003-158557).

FIG. 3 is a functional block diagram showing a configuration of a wireless receiving device used in a mobile communications system (at its base station or mobile station) such as PHS (Personal Handyphone System), as an example of a conventional wireless receiving device employing AGC.

Referring to FIG. 3, the wireless receiving device includes an antenna 1, a low noise amplifier (LNA) 2, a receiving mixer 3, a variable gain amplifier 4, an IF (Intermediate Frequency) mixer 5, an analog/digital (A/D) converter 6, an FIR (Finite Impulse Response) filter 7, a demodulator 8, and a baseband portion 11.

A burst signal in each frame of PHS received by antenna 1 is subjected to low noise amplification in LNA 2, and supplied to receiving mixer 3. Receiving mixer 3 mixes the signal received from LNA 2 with a local oscillation signal received from a local oscillation circuit (not shown), and subjects the mixed signal to frequency conversion to obtain an analog received signal within a predetermined frequency band.

The analog received signal is amplified by variable gain amplifier 4. The wireless receiving device further includes an AGC processing portion 9, a feedback portion 12, and a digital/analog (D/A) converter 13, as portions to control a gain of variable gain amplifier 4.

The analog received signal amplified by variable gain amplifier 4 is supplied to IF mixer 5, and converted to an analog received signal having an intermediate frequency (IF) lower than a radio frequency (RF). Further, the analog received signal is converted to a digital signal by A/D converter 6. The digital signal is supplied to FIR filter 7 for band limiting.

An output of FIR filter 7 is supplied to demodulator 8 and AGC processing portion 9. The functions of demodulator 8 and AGC processing portion 9 are implemented via software, using a digital signal processor (DSP) 10.

For the output signal of FIR filter 7, demodulator 8 performs demodulation processing according to a predetermined modulation scheme (such as $\pi/4$ QPSK (Quadrature Phase Shift Keying) scheme). Further, an output of demodulator 8 is supplied to baseband portion 11 to be subjected to predetermined signal processing (such as synchronous processing, propagation path estimation, adaptive array weight estimation, and the like).

AGC processing portion 9 monitors the supplied digital output of FIR filter 7, and generates a control output for adjusting a variable gain of variable gain amplifier 4 such that a power level of the analog received signal in the relevant frame converges to a predetermined level, for output to a gain control input of variable gain amplifier 4.

More specifically, as shown in FIG. 3, the control output of AGC processing portion 9 passes through feedback portion 12, and is converted to an analog control signal by D/A converter 13. In response to the analog control signal, the gain of variable gain amplifier 4 is adjusted.

In this manner, in a conventional wireless receiving device, AGC processing portion 9 receives a burst signal in each received frame via FIR filter 7 to measure its received power level information, and uses the information for gain adjustment of variable gain amplifier 4. Converging the level of the analog received signal to a predetermined level in each frame by means of the AGC operation described above generally requires a time period of around several symbols from a starting point of each frame. For example, in the mobile communications system such as PHS, the required time period is around 5 symbols.

In a signal format for PHS, for example, the leading part of each frame has a known signal section including a preamble (PR), a unique word (UW), and the like, following a burst transient response period (R) corresponding to a transient state in which the burst signal is rising. A known signal of the known signal section is used to perform a variety of signal processing described above.

Thus, the AGC operation is required to be completed before the known signal section starts. To explain the reason, assume a case where the time period required for the AGC operation extends to part of the known signal section.

During the time period required for the AGC operation described above, several leading symbols of a digital signal in each frame obtained by subjecting the output of variable gain amplifier 4 to digital conversion by A/D converter 6 may have false amplitude values. Accordingly, if this time period extends to part of the known signal section, the relevant part of the known signal section will contain a digital signal having a false amplitude value. When the digital signal has an inappropriate amplitude value, a symbol point cannot be recognized correctly, and thus a reception error occurs in the above signal processing. Therefore, to avoid such a reception error, the AGC operation should be completed before the starting point of the known signal section.

Although not shown, FIR filter 7 in FIG. 3 includes delay elements arranged in a plurality of stages corresponding to respective tap coefficients representing a filter characteristic. Consequently, there arises a delay of a predetermined time amount between the timing when variable gain amplifier 4 receives the received signal and the timing when AGC processing portion 9 receives the received signal via FIR filter 7. This time amount is generally around 2 symbols in a wireless receiving system such as PHS.

Therefore, the AGC operation further requires a time period equivalent to the delay amount of FIR filter 7, resulting in a reception error due to the inappropriate amplitude value described above in the leading part of the received signal.

However, even if a digital signal having a false amplitude value is included in part of the known signal section, the frequency of occurrence of a reception error during signal processing is relatively low when the well-known $\pi/4$ QPSK scheme is employed as the modulation scheme.

Since this scheme makes a determination based on only a phase component of a digital signal, a symbol point is recognized correctly even if the digital signal has an inappropriate amplitude value, and there is low possibility of causing a reception error in signal processing in a later stage.

Recent mobile communications systems have been required to achieve higher-quality, larger-volume transmission as in data communications when compared to conventional voice communications, and modulation schemes using more values than the $\pi/4$ QPSK scheme have been under consideration for application.

As an example of a multi-valued modulation scheme, a well-known 16QAM (Quadrature Amplitude Modulation) scheme has already been practically used in a certain type of data communications. In the 16QAM scheme, a symbol point of a received signal corresponds to one of a total of 16 signal points in a plane with a coordinate system, in which four signal points are arranged in a lattice shape for each quadrant in a plane with IQ coordinates. That is, in this scheme, a symbol point is determined based on both a phase component and an amplitude component of a digital signal.

Therefore, when the 16QAM scheme is employed as a modulation scheme for PHS, if the digital signal has an inappropriate amplitude value, a symbol point is misrecognized as another symbol point having the same phase and a different amplitude value, causing a reception error in signal processing in a later stage.

Further, in the mobile communications system such as PHS, the known signal section is limited to a short section of several symbols in the leading part of each frame, in accordance with a signal format standard, in order to guarantee sufficient transmission data capacity. Consequently, when a multi-valued modulation scheme such as the 16QAM scheme is employed, an amplitude value becomes false in a large section within the known signal section, causing a reception error during digital signal processing.

SUMMARY OF THE INVENTION

An object of the present invention is to provide a wireless receiving device preventing an occurrence of a reception error due to AGC processing, in a mobile communications system having a signal format including a limited known signal section.

According to an aspect of the present invention, there is provided a wireless receiving device processing a received signal made of a signal frame having a known signal section at a leading part, including an amplifier for amplifying the received signal in an analog form with a variable gain; an analog/digital converter for converting the amplified received signal in the analog form to a digital signal; a filter for band-limiting the digital signal; a signal processing portion for performing predetermined signal processing on the band-limited digital signal; and a gain control portion having an input coupled to an output of the analog/digital converter, for monitoring the digital signal such that a level of the received signal amplified in the amplifier converges to a predetermined level, and for generating a control output controlling the variable gain for output to a gain control input of the amplifier.

According to another aspect of the present invention, there is provided a wireless receiving device processing a received signal made of a signal frame having a known signal section at a leading part, including an amplifier for amplifying the received signal in an analog form with a variable gain; an analog/digital converter for converting the amplified received signal in the analog form to a digital signal; a filter for band-limiting the digital signal; a signal processing portion for performing predetermined signal processing on the band-limited digital signal; a gain control portion for monitoring the digital signal such that a level of the received signal amplified in the amplifier converges to a predetermined level, and for generating a control output controlling the variable gain for output to an gain control input of the amplifier; a switch circuit for selectively coupling one of an output of the analog/digital converter and an output of the filter to an input of the gain control portion; and a control signal generating portion for generating a control signal designating a timing of the coupling operation in the switch circuit. The control signal generating portion includes a counter for counting a symbol point from a starting point of the received signal as a count starting point, generates the control signal with a first logic when detecting that a count value of the counter does not reach a predetermined value, and generates the control signal with a second logic when detecting that the count value reaches the predetermined value. The switch circuit couples the output of the analog/digital converter to the input of the gain control portion in response to the control signal with the first logic, and couples the output of the filter to the input of the gain control portion in response to the control signal with the second logic.

Preferably, the predetermined value corresponds to a length of a signal section spent until the gain control portion completes the control on the variable gain in the leading part of the received signal.

As described above, according to the present invention, faster AGC processing can be provided, and a reception error due to AGC processing time can be prevented from occurring to improve transmission quality.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
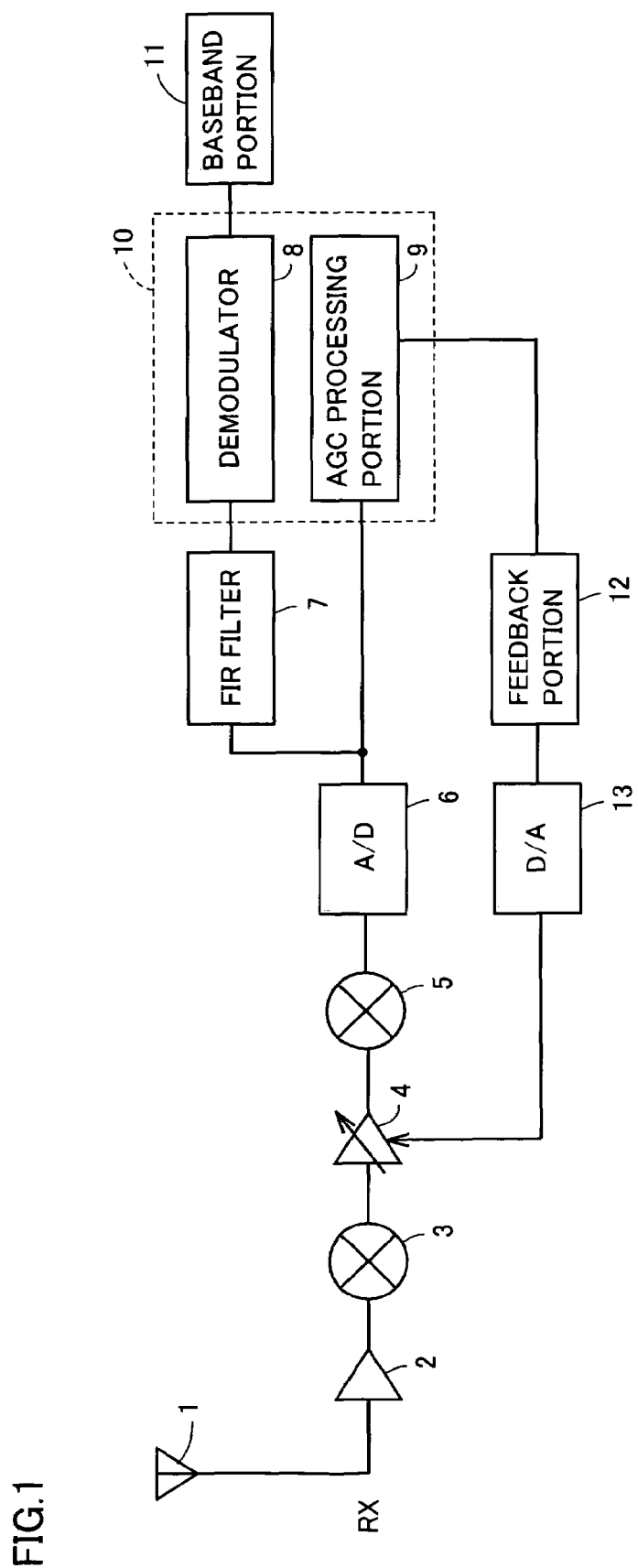
FIG. 1 is a functional block diagram showing a configuration of a wireless receiving device in accordance with a first embodiment of the present invention.

In the following, embodiments of the present invention will be described in detail with reference to the drawings, in which identical or corresponding parts will be designated by the same reference numerals, and the description thereof will not be repeated.

First Embodiment

FIG. 1 is a functional block diagram showing a configuration of a wireless receiving device applied for a base station of a mobile communications system such as PHS, in accordance with a first embodiment of the present invention.

Figure 3:
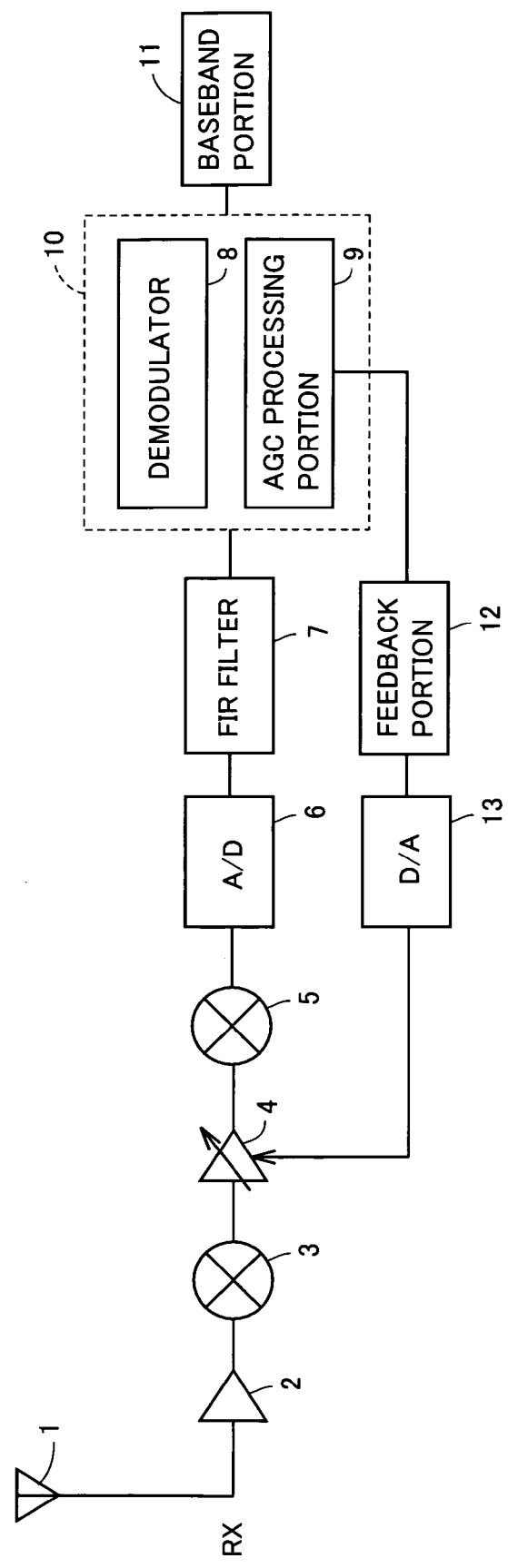
FIG. 3 is a functional block diagram showing a configuration of a conventional wireless receiving device.

The wireless receiving device shown in FIG. 1 is identical to the conventional wireless receiving device shown in FIG. 3, except that the digital signal output from A/D converter 6 is directly supplied to AGC processing portion 9, not via FIR filter 7.

On the other hand, the digital signal band-limited via FIR filter 7 is supplied to demodulator 8, as in the conventional wireless receiving device.

With this configuration, the timing when AGC processing portion 9 receives the digital signal does not include a delay due to FIR filter 7, and is substantially identical to the input timing of variable gain amplifier 4. Therefore, AGC processing portion 9 can exert real-time control on a gain of variable gain amplifier 4 in accordance with an obtained power level of the received signal, performing faster AGC processing than the conventional wireless receiving device.

As a result, the received signal is adjusted to have an appropriate amplitude value from the leading part of each frame, suppressing the occurrence of a reception error due to a false amplitude value caused in a known signal section. This is especially effective in a mobile communications system in which the section length of a known signal section is limited.

As described above, according to the first embodiment of the present invention, faster AGC processing can prevent the occurrence of a reception error and improve transmission quality.

Second Embodiment

Figure 2:
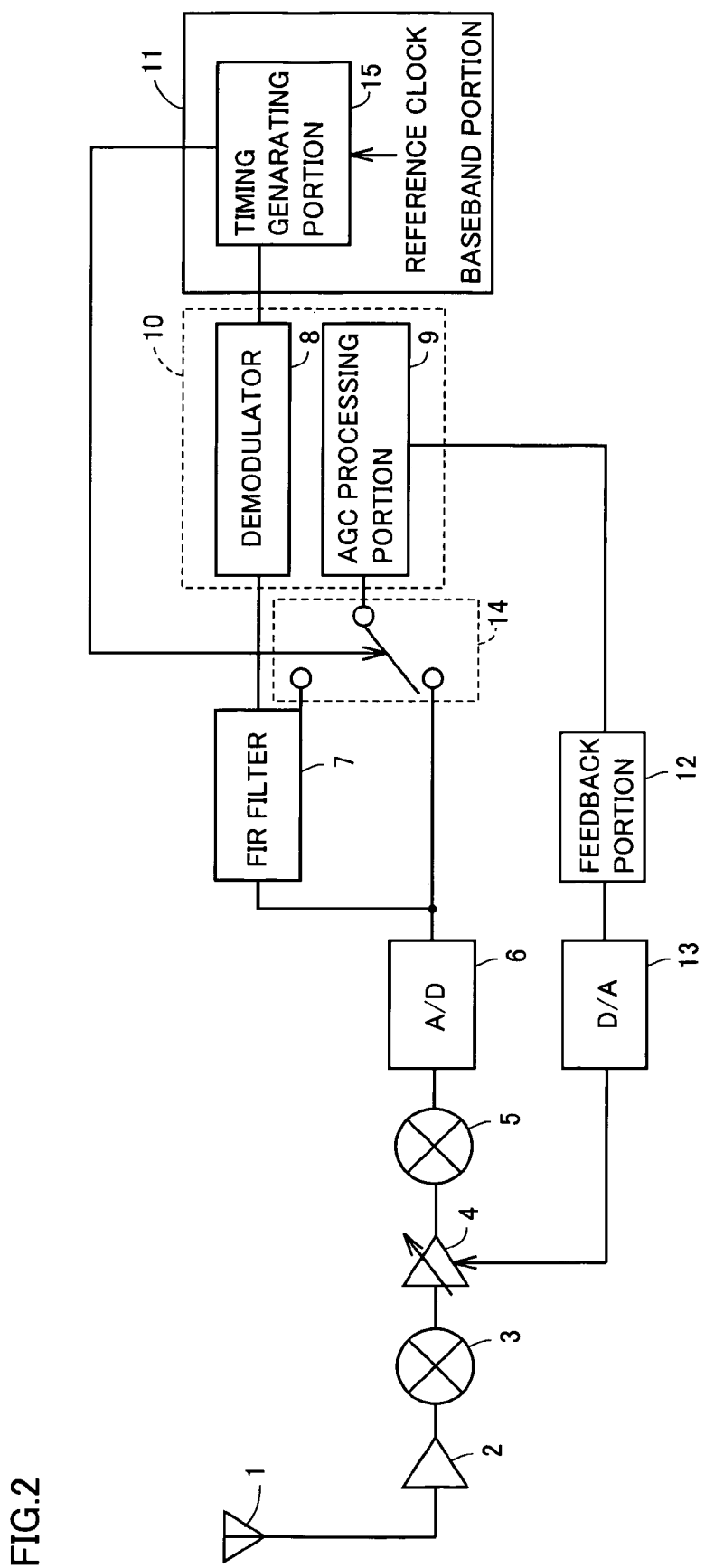
FIG. 2 is a functional block diagram showing a configuration of a wireless receiving device in accordance with a second embodiment of the present invention.

FIG. 2 is a functional block diagram showing a configuration of a wireless receiving device in accordance with a second embodiment of the present invention.

Referring to FIG. 2, the wireless receiving device in accordance with the present embodiment is identical to the wireless receiving device in accordance with the first embodiment shown in FIG. 1, except that it further includes a switch circuit 14 located between A/D converter 6 and AGC processing portion 9, and a timing generating portion 15 generating a control signal controlling a switching operation of switch circuit 14.

Switch circuit 14 selectively couples an input of AGC processing portion 9 to either an output of A/D converter 6 or an output of FIR filter 7, in response to the control signal generated by timing generating portion 15.

As shown in FIG. 2, FIR filter 7 has two outputs in parallel, a first output connected to demodulator 8 within DSP 10, and a second output connected to switch circuit 14.

When the input of AGC processing portion 9 and the output of A/D converter 6 are coupled in switch circuit 14, the digital signal is directly transmitted to AGC processing portion 9. In this case, the digital signal supplied to AGC processing portion 9 does not include a delay amount due to FIR filter 7, as in the first embodiment.

On the other hand, when the input of AGC processing portion 9 and the output of FIR filter 7 are coupled, the digital signal is band-limited, and then supplied to AGC processing portion 9. In this case, the digital signal supplied to AGC processing portion 9 includes a delay amount due to FIR filter 7.

Timing generating portion 15 is located in baseband portion 11, and performs a count operation using a reference clock as a count source. Timing generating portion 15 outputs the control signal in response to the timing when a count value reaches a predetermined value, to switch a coupling state of switch circuit 14.

More specifically, timing generating portion 15 counts a symbol point in response to the reference clock, from the leading part of each frame as a count starting point. Until the count value reaches a signal section length (for example, 5 symbols) required for AGC processing, timing generating portion 15 outputs the control signal in a first logic state. Switch circuit 14 selectively couples the output of A/D converter 6 and the input of AGC processing portion 9 in response to the control signal in the first logic state. Thus, the digital signal from A/D converter 6 is directly supplied to AGC processing portion 9, and AGC processing is performed quickly without being affected by a delay due to FIR filter 7.

Further, when the count value reaches the signal section length described above, timing generating portion 15 outputs the control signal in a second logic state. Switch circuit 14 couples the output of FIR filter 7 and the input of AGC processing portion 9 in response to the control signal in the second logic state. Thus, the digital signal from A/D converter 6 is band-limited in FIR filter 7 and supplied to AGC processing portion 9.

At this timing, gain control performed immediately after the starting of each frame of the received signal has been completed, and the received signal is in a steady state with a stable amplitude value. In the steady state, the received signal exhibits only a small fluctuation, and the change in a gain control amount of variable gain amplifier 4 is also small. Therefore, the influence of the delay due to FIR filter 7 is considered to be small.

As described above, according to the second embodiment of the present invention, the leading part of each frame of the received signal is subjected to real-time gain control, and thus a reception error due to an inappropriate amplitude value in AGC processing can be prevented from occurring, enabling improvement in transmission quality.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wireless receiving device processing a received signal made of a signal frame having a known signal section at a leading part, comprising:

an amplification portion amplifying said received signal in an analog form with a variable gain;

an analog/digital conversion portion converting said amplified received signal in the analog form to a digital signal;

a filter portion band-limiting said digital signal;

a demodulation processing portion having an output of said filter portion coupled thereto, and performing demodulation processing according to a predetermined demodulation scheme on said band-limited digital signal;

a gain control portion providing a control output controlling said variable gain to said amplification portion in accordance with a level of the received signal amplified in said amplification portion;

a switch portion selectively outputting any one of an output of said analog/digital conversion portion and the output of said filter portion to said gain control portion;

a control signal generating portion generating a control signal designating a timing of the selective output operation in said switch portion; and a count portion counting a symbol number from a count starting point in accordance with a reference clock, the count starting point being a starting point of the signal frame of each received signal outputted by said demodulation processing portion, wherein said control signal generating portion generates a first control signal at the starting point of each signal frame, and when the symbol number counted by said count portion reaches a predetermined value, generates a second control signal, said switch portion outputs the output of said analog/digital conversion portion to said gain control portion in response to said first control signal, and outputs the output of said filter portion to said gain control portion in response to said second control signal, and said predetermined value corresponds to a signal section length required by said gain control portion for processing of the variable gain at the leading part of said received signal.

2. A wireless receiving device processing a received signal made of a signal frame having a known signal section at a leading part, comprising:

an amplification portion amplifying said received signal in an analog form with a variable gain based on a power level of said received signal;

an analog/digital conversion portion converting said amplified received signal in the analog form to a digital signal;

a filter portion band-limiting said digital signal;

a demodulation processing portion having an output of said filter portion coupled thereto, and performing demodulation processing according to a predetermined demodulation scheme on said band-limited digital signal;

a gain control portion providing a control output controlling said variable gain to said amplification portion in accordance with a level of the received signal amplified in said amplification portion;

a switch portion selectively outputting any one of an output of said analog/digital conversion portion and the output of said filter portion to said gain control portion;

a control signal generating portion generating a control signal designating a timing of the selective output operation in said switch portion; and a count portion counting a symbol number from a count starting point in accordance with a reference clock, the count starting point being a starting point of the signal frame of each received signal outputted by said demodulation processing portion, wherein said control signal generating portion generates a first control signal at the starting point of each signal frame, and when the symbol number counted by said count portion reaches a predetermined value, generates a second control signal, said switch portion outputs the output of said analog/digital conversion portion to said gain control portion in response to said first control signal, and outputs the output of said filter portion to said gain control portion in response to said second control signal, and said predetermined value corresponds to a signal section length required by said gain control portion for processing of the variable gain at the leading part of said received signal.

* * * * *